US008829523B2

(12) United States Patent
Qin et al.

(10) Patent No.: US 8,829,523 B2
(45) Date of Patent: Sep. 9, 2014

(54) THIN FILM TRANSISTOR MANUFACTURING METHOD

(71) Applicant: Shenzhen China Star Optoelectronics Technology Co., Ltd., Shenzhen (CN)

(72) Inventors: Shijian Qin, Shenzhen (CN); Chengming He, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/071,284

(22) Filed: Nov. 4, 2013

(65) Prior Publication Data

US 2014/0057400 A1 Feb. 27, 2014

Related U.S. Application Data

(62) Division of application No. 13/376,970, filed as application No. PCT/CN2011/080158 on Sep. 26, 2011, now Pat. No. 8,629,507.

(30) Foreign Application Priority Data

Jul. 14, 2011 (CN) .......................... 2011 1 0197080

(51) Int. Cl.
*H01L 29/04* (2006.01)
*H01L 31/20* (2006.01)
*H01L 31/036* (2006.01)
*H01L 31/0376* (2006.01)
*H01L 29/786* (2006.01)
*H01L 29/66* (2006.01)

(52) U.S. Cl.
CPC .... *H01L 29/66765* (2013.01); *H01L 29/78618* (2013.01)

USPC ........................ 257/59; 257/34; 257/E33.053

(58) Field of Classification Search
USPC ............................... 438/34; 259/59, E33.053
See application file for complete search history.

(56) References Cited

U.S. PATENT DOCUMENTS

| 5,583,369 A | 12/1996 | Yamazaki et al. |
| 7,476,896 B2 | 1/2009 | Choi et al. |
| 7,656,491 B2 | 2/2010 | Yamazaki et al. |
| 7,777,855 B2 | 8/2010 | Jung |
| 8,021,937 B2 | 9/2011 | Roh et al. |
| 8,093,112 B2 | 1/2012 | Miyairi et al. |
| 8,203,539 B2 | 6/2012 | Kim et al. |
| 2006/0223222 A1 | 10/2006 | Choi et al. |
| 2007/0287232 A1 | 12/2007 | Lim et al. |
| 2010/0277659 A1* | 11/2010 | Yang et al. ...................... 349/42 |
| 2011/0033991 A1* | 2/2011 | Hur ................................. 438/158 |
| 2012/0138938 A1 | 6/2012 | Bae et al. |

FOREIGN PATENT DOCUMENTS

| CN | 1855393 | 11/2006 |
| CN | 1992291 | 7/2007 |
| CN | 101043006 | 9/2007 |
| CN | 101086969 | 12/2007 |

(Continued)

*Primary Examiner* — Phuc Dang
(74) *Attorney, Agent, or Firm* — Diederiks & Whitelaw, PLC

(57) ABSTRACT

The present invention provides a thin film transistor (TFT) manufacturing method and a TFT, a source electrode or drain electrode of the TFT is electrically connected to a data line directly during a forming process by providing a through hole in a surface above the data line of the TFT, so as to save the process cost. Further, the source electrode and drain electrode of the TFT are also manufactured with poly-silicon rather than metal material used in prior art, processing steps are simplified, thereby further saving the process cost.

5 Claims, 4 Drawing Sheets

(56) References Cited

FOREIGN PATENT DOCUMENTS

| | | |
|---|---|---|
| CN | 101114619 | 1/2008 |
| CN | 101350331 | 1/2009 |
| CN | 101419973 | 4/2009 |
| CN | 101552277 | 10/2009 |
| CN | 101609236 | 12/2009 |
| CN | 101740499 | 6/2010 |
| CN | 101893799 | 11/2010 |

\* cited by examiner

THIN FILM TRANSISTOR MANUFACTURING METHOD

CROSS REFERENCE TO RELATED APPLICATION

The present application represents a divisional application of U.S. patent application Ser. No. 13/376,970 entitled "Thin Film Transistor Manufacturing Method and Thin Film Transistor" filed Dec. 8, 2011, pending, which represents a National stage application of PCT/CN2011/080158 entitled "Thin Film Transistor Manufacturing Method and Thin Film Transistor" filed Sep. 26, 2011, pending.

TECHNICAL FIELD OF THE INVENTION

The present invention relates to a field of liquid crystal display (LCD) manufacture, and more particularly, to a thin film transistor (TFT) manufacturing method and a TFT.

BACKGROUND OF THE INVENTION

An organic light emitting diode (OLED) is concerned by people more and more. An OLED screen usually utilizes an amorphous silicon (a-Si) TFT for driving, however, an electron mobility of an a-Si TFT switch device is too low to satisfy a current driving scheme of the OLED screen. Accordingly, it is particularly important to change the a-Si into poly-silicon for lifting the electron mobility so as to improve electrical characteristics of the TFT switch device.

The current technique has shortcomings that the TFT is directly formed on a transparent substrate, therefore it is necessary to grow a multi-laminated structure thereon, in addition, it is also necessary to manufacture electrical connection structure between the TFT and external components, so that the working process is complicated, and the cost is higher.

SUMMARY OF THE INVENTION

In order to solve the technical problems above, the present invention provides a TFT manufacturing method and a TFT, by which the processing cost can be saved.

To solve the above problems, the present invention provides a TFT manufacturing method, which comprises steps of: providing a transparent substrate; forming a gate electrode and a data line on a surface of the transparent substrate; forming a first insulation layer covering the gate electrode and the data line on the surface of the transparent substrate; forming an amorphous semiconductor layer on a surface of the first insulation layer in an area corresponding to the gate electrode; forming a through hole on the surface of the first insulation layer in an area corresponding to the data line; forming a conductive layer, which covers the amorphous semiconductor layer and the through hole, on the surface of the first insulation layer; removing a portion of the conductive layer corresponding to the gate electrode to cut the conductive layer, thereby forming a source electrode and a drain electrode of the TFT; forming a second insulation layer, which covers the amorphous semiconductor layer, the through hole and the source electrode as well as the drain electrode, on the surface of the first insulation layer; and irradiating the amorphous semiconductor layer by laser to increase an ordering degree of a lattice arrangement of the amorphous semiconductor layer.

The present invention further provides a TFT, which comprises: a transparent substrate; a gate electrode and a data line, which are disposed on a surface of the transparent substrate; a first insulation layer, which covers the gate electrode and the data line; an amorphous semiconductor layer, which is disposed on a surface of the first insulation layer in an area corresponding to the gate electrode; a through hole, which is disposed in an area of the surface of the first insulation layer corresponding with the data line; a source electrode and a drain electrode, which are disposed at two ends of the amorphous semiconductor layer, and one of the source electrode and the drain electrode being connected to the data line via the through hole; and the second insulation layer, which is on the surface of the first insulation layer and covers the amorphous semiconductor layer, the through hole and the source electrode as well as the drain electrode.

The present invention further provides a TFT, which comprises: a transparent substrate; a gate electrode and a data line, which are disposed on a surface of the transparent substrate; a first insulation layer, which covers the gate electrode and the data line; an amorphous semiconductor layer, which is disposed on a surface of the first insulation layer in an area corresponding to the gate electrode, the amorphous semiconductor comprising a first amorphous semiconductor layer and a second amorphous semiconductor layer having the same conductive type and being laminated, the first amorphous semiconductor layer being attached with the first insulation layer, a conductivity of the second amorphous semiconductor layer being higher than that of the first amorphous semiconductor layer; a through hole, which is disposed in an area of the surface of the first insulation layer corresponding with the data line; a source electrode and a drain electrode, which are disposed at two ends of the amorphous semiconductor layer, and one of the source electrode and the drain electrode being connected to the data line via the through hole, the second amorphous semiconductor layer being attached with the source electrode and the drain electrode; and the second insulation layer, which is on the surface of the first insulation layer and covers the amorphous semiconductor layer, the through hole and the source electrode as well as the drain electrode, a portion of the second insulation layer between the source electrode and the drain electrode being hollowed.

An advantage of the present invention is that the source electrode or the drain electrode of the TFT is electrically connected with the data line directly during the forming process, so the processing cost is saved. Further, the source electrode and the drain electrode are also manufactured with poly-silicon rather than metal material used in the current technique, so that processing steps are simplified, and thereby further saving the processing cost.

DETAILED DESCRIPTION OF THE INVENTION

Embodiments of the TFT manufacturing method and the TFT provided by the present invention will be described in detail by referring to the accompanying drawings.

In order to manifest objectives, features and advantages of the present invention, preferable embodiments will be described in detail in conjunction with the drawings accompanying with the specification. Amongst, each component in the embodiments is arranged for clearly describing the contents disclosed in the present invention but not used to limit the present invention. Furthermore, some reference numbers are replicated in different embodiments for the reason of simplifying the descriptions rather than implying correlation among the different embodiments.

Figure 1:
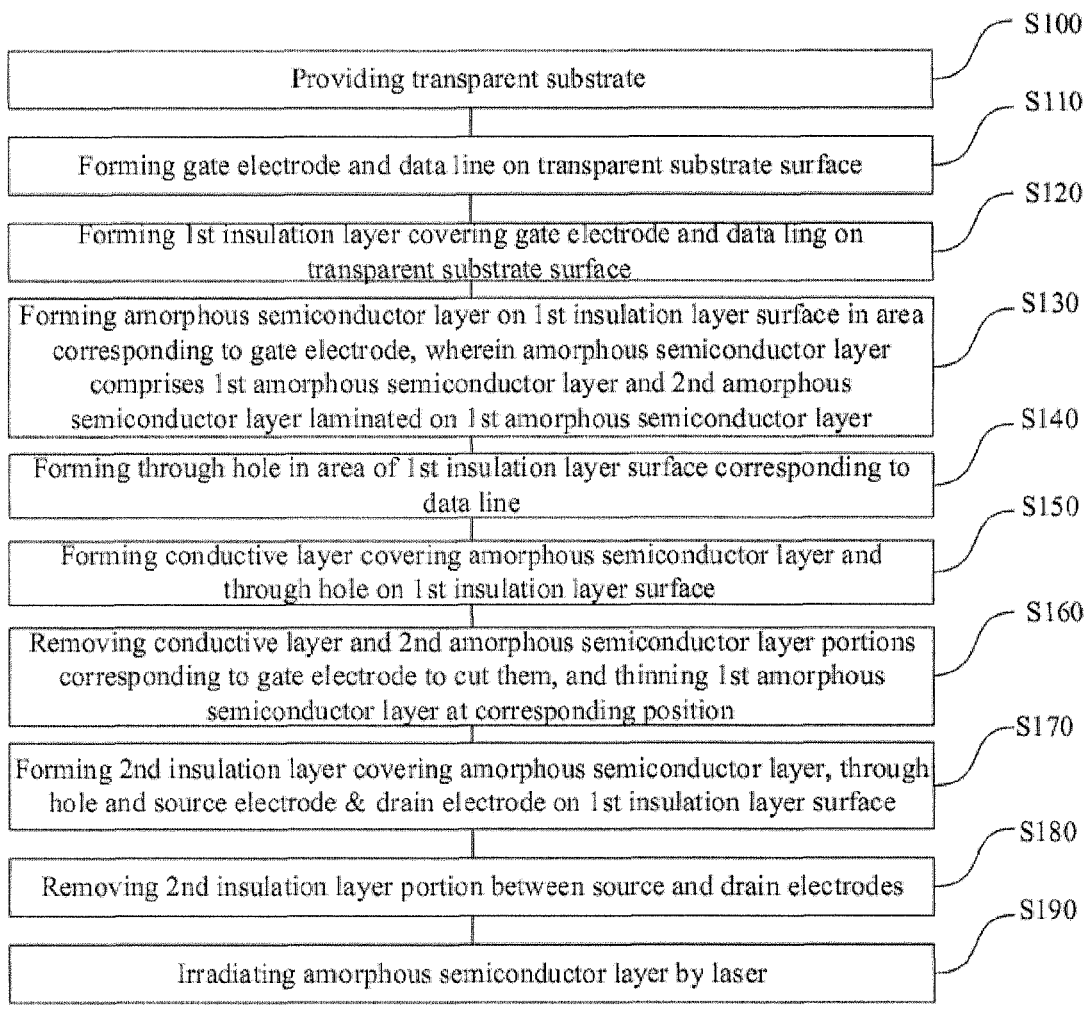
FIG. 1 shows a flow chart of steps of a method described in an embodiment of the present invention.

FIG. 1 shows a flow chart of steps of a method described in an embodiment of the present invention, which comprises: step S100, providing a transparent substrate; step S110, forming a gate electrode of a TFT and a data line on a surface of the transparent substrate; step S120, forming a first insulation layer which covers the gate electrode and the data line on the surface of the transparent substrate; step S130, forming an amorphous semiconductor layer on a surface of the first insulation layer in an area corresponding to the gate electrode, wherein the amorphous semiconductor layer comprises a first amorphous semiconductor layer and a second amorphous semiconductor layer, the second amorphous semiconductor layer is laminated on the first amorphous semiconductor layer; step S140, forming a through hole in an area of the surface of the first insulation layer corresponding to the data line; step S150, forming a conductive layer which covers the amorphous semiconductor layer and the through hole on the surface of the first insulation layer; step S160, removing a portion of the conductive layer, a portion of the second amorphous semiconductor layer and a portion of the first amorphous semiconductor layer, which correspond to the gate electrode, to cut the conductive layer and the second amorphous semiconductor layer and to thin the first amorphous semiconductor layer, so as to form a source electrode and a drain electrode of the TFT; step S170, forming a second insulation layer, which covers the amorphous semiconductor layer, the through hole as well as the source electrode and the drain electrode, on the surface of the first insulation layer; step S180, removing a portion of the second insulation layer, which is located between the source electrode and the drain electrode; step S190, irradiating the amorphous semiconductor layer with laser to increase the ordering degree of the lattice arrangement of the amorphous semiconductor layer.

FIG. 2A to FIG. 2J show schematic diagrams of processing of the method described in the embodiment of the present invention.

Figure 2A:
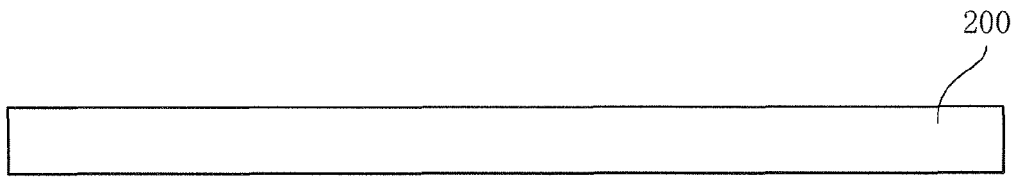
FIG. 2A to FIG. 2J show schematic diagrams of processing of the method described in the embodiment of the present invention.

As shown in FIG. 2A, with reference to step S100, the transparent 200 is provided. The material of the transparent substrate 200 may be any of the common materials including glass.

Figure 2B:
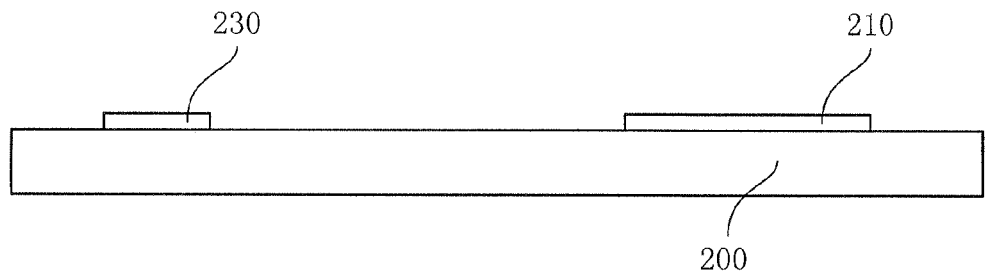

As shown in FIG. 2B, with reference to step S110, a gate electrode 210 of a TFT and a data line 230 are formed on a surface of the transparent substrate 200. The material of the gate electrode 210 and the data line 230 may be conductive material such as poly-silicon or metal. In the present embodiment, the gate electrode 210 and the date line 230 are manufactured at the same time in this step. Furthermore, in the following steps, the electrical connection between the data line 230 and a source electrode of the TFT or a drain electrode of the TFT is formed by integrating process at the same time when the TFT is formed, so as to reduce the processing steps.

Figure 2C:
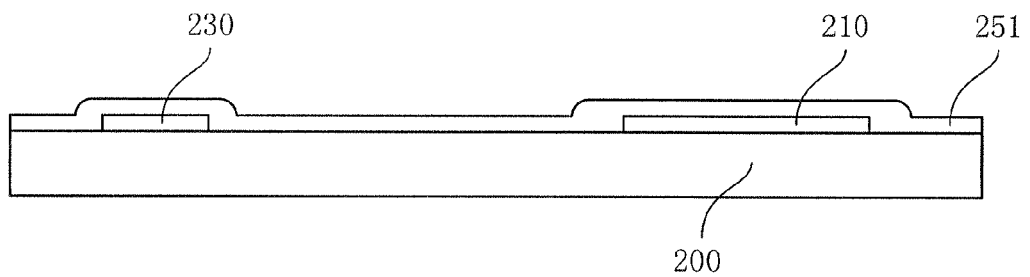

As shown in FIG. 2C, with reference to step S120, a first insulation layer 251, which covers the gate electrode 210 and the data line 230, is formed on the surface of the transparent substrate 200. The material of the first insulation layer 251 may be silicon oxide, silicon nitride or other insulating materials. And the forming method of the first insulation layer 251 may be any common processing method such as chemical vapor deposition (CVD) or physical vapor deposition (PVD).

Figure 2D:
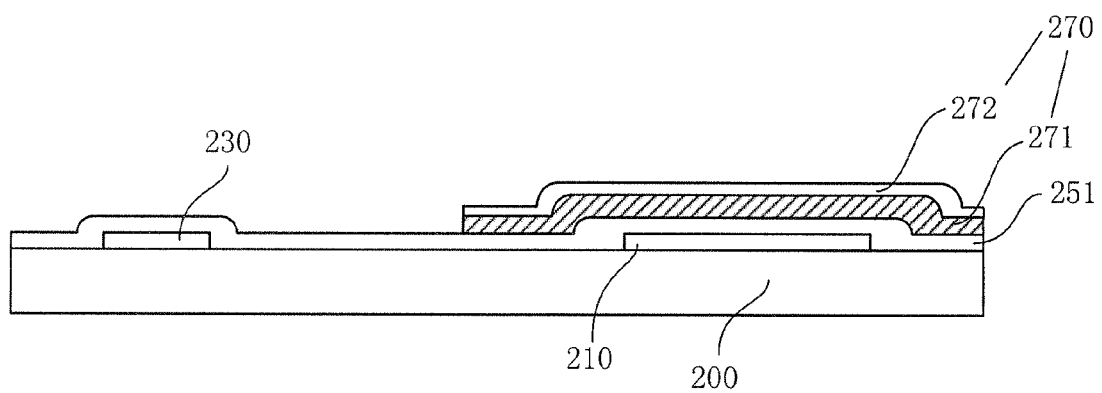

As shown in FIG. 2D, with reference to step S130, an amorphous semiconductor layer 270 is formed on a surface of the first insulation layer 251 in an area corresponding to the gate electrode 210. The material of the amorphous semiconductor layer 270 may be amorphous silicon, or other common semiconductor materials such as Gallium arsenide or Silicon-germanium. The forming method of the amorphous semiconductor layer 270 may comprise: firstly, epitaxizing or depositing a continuous amorphous semiconductor material on the surface of the first insulation layer 251, and then an amorphous semiconductor layer 270 as shown in FIG. 2D is formed by retaining a designated area through an photo etch process. A doping concentration of the amorphous semiconductor layer 270 can be adjusted by controlling a dopant dosage supplied in the epitaxy or deposition process.

Still with reference to FIG. 2D, in the present embodiment, the amorphous semiconductor 270 further comprises a first amorphous semiconductor layer 271 and a second amorphous semiconductor layer 272, which are laminated and are of the same conductive type. The first amorphous semiconductor layer 271 is attached to the first insulation layer 251. The second amorphous semiconductor layer 272 is exposed in this step, and will be attached to the source electrode of the TFT and the drain electrode of the TFT in the subsequent step. The conductivity of the second amorphous layer 272 is higher than that of the first amorphous layer 271, A high conductivity means a high doping concentration (for example, N-doped amorphous silicon with a high doping concentration), and the high doping concentration is advantageous to forming a good ohm contact with the source electrode and the drain electrode, while a semiconductor layer with a low doping concentration is easier to be controlled by the gate electrode of the TFT to change the conductive type thereof. So it is selected to divide the amorphous semiconductor 270 into the low doped first amorphous semiconductor layer 271 and the high doped second amorphous semiconductor layer 272 in the present embodiment.

Figure 2E:
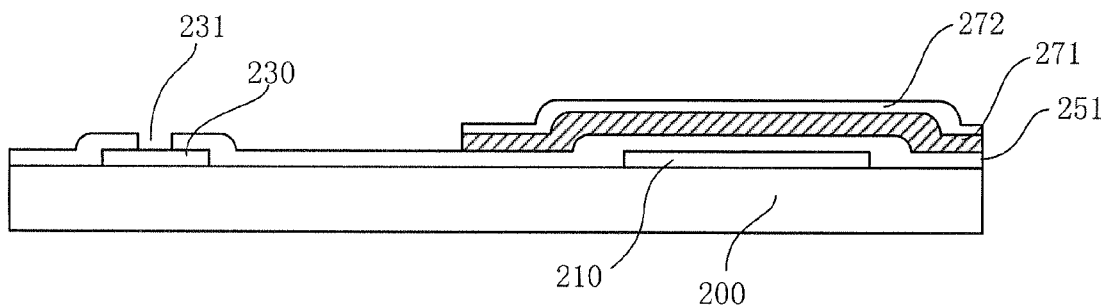

As shown in FIG. 2E, with reference to step S140, a through hole 231 is formed in an area of the surface of the first insulation layer 251 corresponding to the data line 230. The step of forming the through hole 231 can be done by photo etch process. The function of the through hole 231 is forming an electrical connection between the data line 230 and the source electrode or drain electrode subsequently.

Figure 2F:
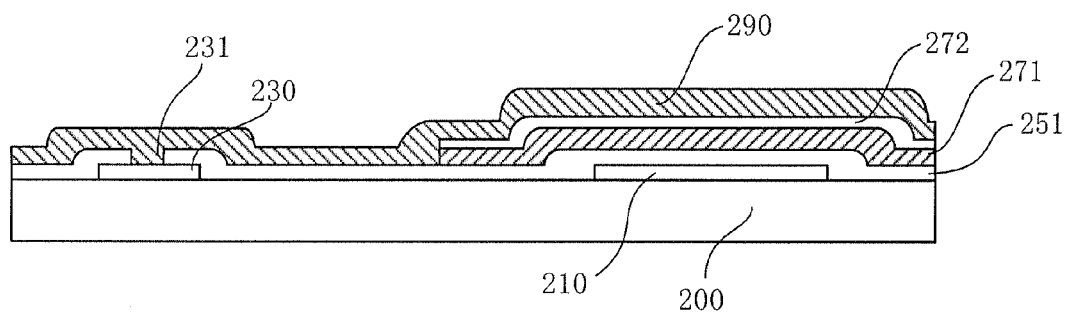

As shown in FIG. 2F, with reference to step S150, a conductive layer 290, which covers the amorphous semiconductor layer 270 and the through hole 231, is formed on the surface of the first insulation layer 251. The material of the conductive layer 290 may be one selected from indium tin oxide (ITO) and indium zinc oxide (IZO). The forming method, for example, may be spin-coating, spray-coating or the like. The conductive layer 290 covers the through hole 231, and is attached to the data line 230 below the through hole 231, so as to implement the electrical connection.

Figure 2G:
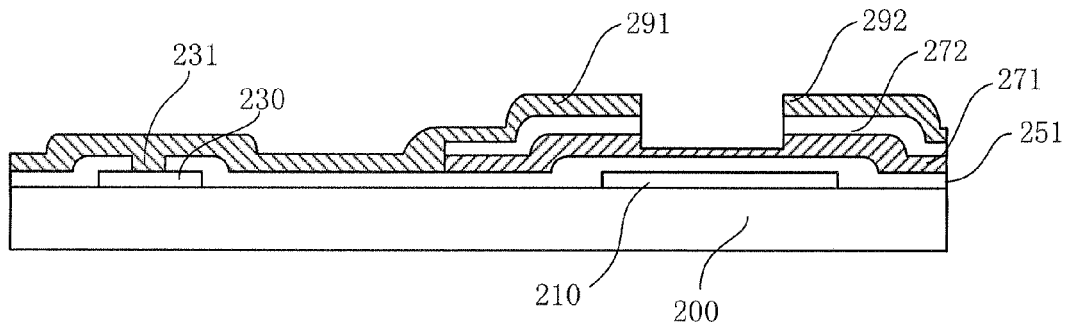

As shown in FIG. 2G, with reference to step S160, a portion of the conductive layer 290, a portion of the second amorphous semiconductor layer 272 and a portion of the first amorphous semiconductor layer 271, which correspond to the gate electrode 210, are removed to cut the conductive layer 290 and the second amorphous semiconductor layer 272, and to thin the first amorphous conductive layer 271, so as to form a source electrode 291 and a drain electrode 292 of the TFT. Amongst, a location of the source electrode 291 and a location of the drain electrode 292 may be exchanged. The processes of cutting the conductive layer 290 and the second amorphous semiconductor layer 272 and thinning the first amorphous semiconductor layer 271 may be implemented by utilizing photo etch process. Since the electrical connection between the conductive layer 290 and the data line 230 has been established in the previous step, therefore it is not necessary to manufacture an electrical connection structure between the source electrode 291, which is formed in the present embodiment, and the data line 230 additionally.

Figure 2H:
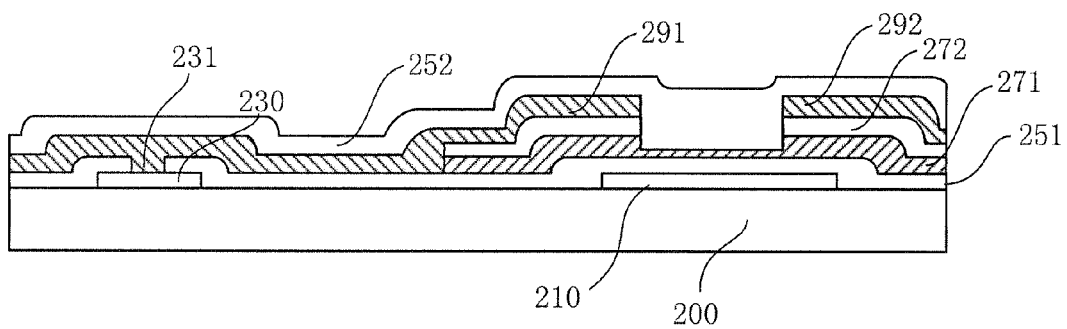

As shown in FIG. 2H, with reference to step S170, a second insulation layer 252, which covers the amorphous semiconductor layer 270, the through hole 231 as well as the source electrode 291 and the drain electrode 292, is formed on the surface of the first insulation layer 251. The material of the second insulation layer 252, of which the function is protecting the covered amorphous semiconductor layer 270, the through hole 231 as well as the source electrode 291 and drain electrode 292, may be an arbitrary one of insulating materials including silicon oxide and silicon nitride.

Figure 2I:
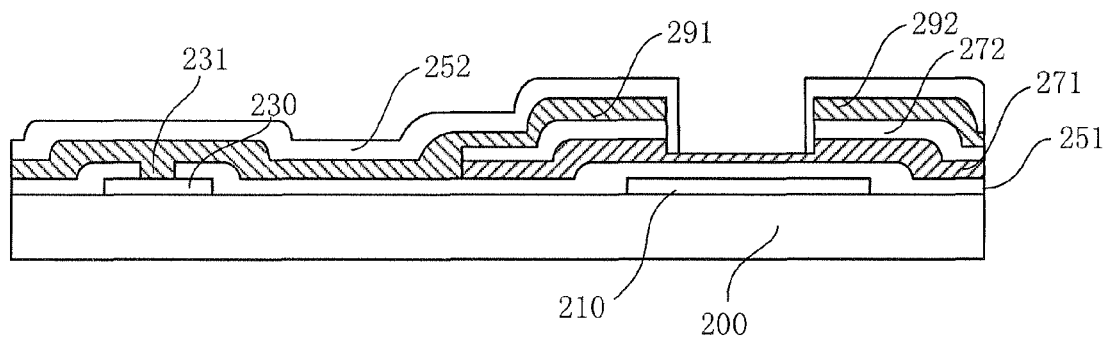

As shown in FIG. 2I, with reference to step S180, a portion of the second insulation layer 252, which is located between the source electrode 291 and the drain electrode 292, is removed. This step is used for forming a pixel electrode pattern.

Figure 2J:
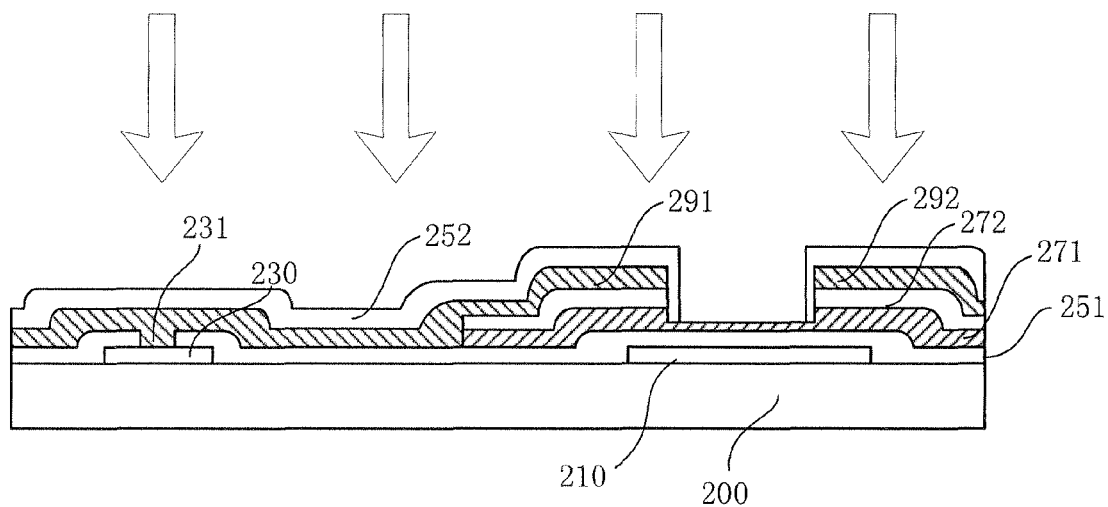

As shown in FIG. 2J, with reference to step S190, the amorphous semiconductor layer 270 is irradiated by laser to increase the ordering degree of the lattice arrangement of the amorphous semiconductor layer 270. The amorphous semiconductor layer 270 is annealed under the irradiation of the laser, and transforms from an amorphous material to a polycrystalline material. The amorphous material may transforms into the polycrystalline material under a circumstance that the laser power is sufficiently high and the irradiation continues for a sufficiently long time. The ordering degree of the lattice of the polycrystalline material is better, so it has a higher carrier mobility, and therefore is able to improve the electrical performances of the TFT. Since the thickness of the second insulation layer 252 is usually less than that of the transparent substrate 200, it is preferred that the laser enters from the side of the second insulation layer 252, and the laser should have a wavelength that is able to penetrate the second insulation layer 252 and the conductive layer 290. In a condition that the material of the second insulation layer 252 is silicon nitride or silicon oxide and the material of the conductive layer 290 is ITO or IZO, lasers of a visible light band and an infrared band are all transparent to these materials.

Still with reference to FIG. 2J, the TFT obtained after the above steps are executed completely comprises a structure as described below: the transparent substrate 200; the gate electrode 210 and the data line 230, which are disposed on a surface of the transparent substrate 200; the first insulation layer 251, which covers the gate electrode 210 and the data line 230; the amorphous semiconductor layer 270, which comprises the first amorphous semiconductor layer 271 and the second amorphous semiconductor layer 272, and is provided on the surface of the first insulation layer 251 in the area corresponding to the gate electrode 210; the through hole 231, which is provided in the area of the surface of the first insulation layer 251 corresponding to the data line 230; the source electrode 291 and the drain electrode 292, which are provided at two ends of the amorphous semiconductor layer 270, and one of which is connected to the data line 230 via the through hole 231; and the second insulation layer 252, which is on the surface of the first insulation layer 251 and covers the amorphous semiconductor layer 270, the through hole 231 as well as the source electrode 291 and the drain electrode 292, and of which the portion between the source electrode 291 and the drain electrode 292 is hollowed. The thickness of the first amorphous semiconductor layer 271 of the portion between the source electrode 291 and the drain electrode 292 is less than that of the other portions of the first amorphous semiconductor layer 271.

The above are only preferred embodiments of the present invention, it is noted that various modifications and alterations can be made by persons skilled in this art without departing from the principles of the present invention, and therefore those modifications and alterations should also be deemed to be in the protection range of the present invention.

What is claimed is:

1. A thin film transistor manufacturing method, characterized in that, comprising steps of:
    providing a transparent substrate;
    forming a gate electrode and a data line on a surface of the transparent substrate;
    forming a first insulation layer, which covers the gate electrode and the data line, on the surface of the transparent substrate;
    forming an amorphous semiconductor layer on a surface of the first insulation layer in an area corresponding to the gate electrode;
    forming a through hole in an area of the surface of the first insulation layer corresponding to the data line;
    forming a conductive layer, which covers the amorphous semiconductor layer and the through hole, on the surface of the first insulation layer;
    removing a portion of the conductive layer corresponding to the gate electrode to cut the conductive layer, thereby forming a source electrode and a drain electrode of the thin film transistor;
    forming a second insulation layer, which covers the amorphous semiconductor layer, the through hole, as well as the source electrode and the drain electrode, on the surface of the first insulation layer;
    removing a portion of the second insulation layer located between the source electrode and the drain electrode; and
    irradiating the amorphous semiconductor layer by a laser to increase an ordering degree of a lattice of the amorphous semiconductor layer.

2. The thin film transistor manufacturing method according to claim 1, characterized in that, the amorphous semiconductor layer comprises a first amorphous semiconductor layer and a second amorphous semiconductor layer, which are laminated and have a same conductive type, the first amorphous semiconductor layer is attached to the first insulation layer, the second amorphous semiconductor layer is attached to the source electrode and the drain electrode, a conductivity of the second amorphous semiconductor layer is higher than that of the first amorphous semiconductor layer.

3. The thin film transistor manufacturing method according to claim 2, characterized in that, the amorphous semiconductor layer is formed by utilizing an epitaxizing method, and the first amorphous semiconductor layer and the second amorphous layer are formed by changing concentration of a dopant during epitaxizing.

4. The thin film transistor manufacturing method according to claim 2, characterized in that, the step of cutting the conductive layer further comprises a step of removing a portion of the second amorphous semiconductor layer corresponding to the gate electrode at the same time.

5. The thin film transistor manufacturing method according to claim 3, characterized in that, the step of cutting the second amorphous semiconductor layer further comprises a step of thinning the first amorphous semiconductor layer exposed.

* * * * *